US012658260B2

(12) United States Patent
Tseng

(10) Patent No.: US 12,658,260 B2
(45) Date of Patent: Jun. 16, 2026

(54) CONTENT-ADDRESSABLE MEMORY DEVICE AND OPERATING METHOD THEREOF

(71) Applicant: MACRONIX INTERNATIONAL CO., LTD., Hsinchu (TW)

(72) Inventor: Po-Hao Tseng, Taichung City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 120 days.

(21) Appl. No.: 18/655,467

(22) Filed: May 6, 2024

(65) Prior Publication Data

US 2025/0342885 A1     Nov. 6, 2025

(51) Int. Cl.
*G11C 16/08* (2006.01)
*G11C 16/04* (2006.01)
*G11C 16/26* (2006.01)

(52) U.S. Cl.
CPC .......... *G11C 16/08* (2013.01); *G11C 16/0483* (2013.01); *G11C 16/26* (2013.01)

(58) Field of Classification Search
CPC ...... G11C 16/08; G11C 16/0483; G11C 16/26
See application file for complete search history.

(56) References Cited

U.S. PATENT DOCUMENTS 6,449,188 B1 * 9/2002 Fastow .............. G11C 16/0416
                                                 365/185.17
11,410,727 B1 * 8/2022 Hoang ............... G11C 16/3404

2014/0347933 A1 11/2014 Lee
2015/0003164 A1 1/2015 Roohparvar
2016/0172037 A1 6/2016 Lee
2023/0161896 A1 * 5/2023 Ogura Iwasaki ....... G06F 12/10
                                                 726/17
2023/0368841 A1 * 11/2023 Lue .................... G11C 16/0483

FOREIGN PATENT DOCUMENTS

EP         3284093 B1 * 8/2021 ............. G11C 17/14
TW     202405813 A     2/2024

OTHER PUBLICATIONS

Tseng, et al.: "In-Memory Approximate Computing Architecture Based on 3D-NAND Flash Memories"; 2022 Symposium on VLSI Technology & Circuits Digest of Technical Papers; pp. 270-271.
Tseng, et al.: "In-Memory-Searching Architecture Based on 3D-NAND Technology with Ultra-high Parallelism"; 978-1-7281-8888-1/20/ $31.00 © 2020 IEEE; pp. 36.1.1-36.1.4.

* cited by examiner

*Primary Examiner* — Amir Zarabian
*Assistant Examiner* — Bradley S Coon
(74) *Attorney, Agent, or Firm* — McClure, Qualey & Rodack, LLP

(57) ABSTRACT

An operating method of a memory device includes: carrying a first search bit by a first string select line signal; controlling a first switch element by the first string select line signal; storing a first data bit by second and third switch elements; and comparing the first search bit and the first data bit to generate a first bit line signal. In response to the first search bit having a first logic value, the first string select line signal has first and second voltage levels in order, in response to the first search bit having a second logic value, the first string select line signal has the second and first voltage levels in order, the second voltage level is different from the first voltage level, and the first, second and third switch elements are coupled in series.

20 Claims, 12 Drawing Sheets

Fig. 2B

CONTENT-ADDRESSABLE MEMORY DEVICE AND OPERATING METHOD THEREOF

BACKGROUND

Technical Field

The present disclosure relates to a memory technique. More particularly, the present disclosure relates to a memory device and an operating method of a memory device.

Description of Related Art

A memory device includes multiple memory cells configured to store data bits. For performing in-memory search, word line signals carry search data to compare with store data stored by the memory cells, to determine whether the search data and the store data are match. However, in the approaches described above, two word line signals are required to carry one search bit, such that a length of the search data is shorter. Thus, techniques associated with the designing for overcoming the problems described above are important issues in the field.

SUMMARY

The present disclosure provides an operating method of a memory device. The operating method includes: carrying a first search bit by a first string select line signal; controlling a first switch element by the first string select line signal; storing a first data bit by a second switch element and a third switch element; and comparing the first search bit and the first data bit to generate a first bit line signal. In response to the first search bit having a first logic value, the first string select line signal has a first voltage level and a second voltage level in order, in response to the first search bit having a second logic value, the first string select line signal has the second voltage level and the first voltage level in order, the first logic value is different from the second logic value, the second voltage level is different from the first voltage level, and the first switch element, the second switch element and the third switch element are coupled in series.

In some embodiment, comparing the first search bit and the first data bit includes: controlling the second switch element and the third switch element by a first word line signal and a second word line signal, respectively; and adjusting the first word line signal from a read voltage level to a pass voltage level. When the first word line signal has the read voltage level, the second word line signal has the pass voltage level, and when the first word line signal has the pass voltage level, the second word line signal has the read voltage level.

In some embodiment, comparing the first search bit and the first data bit includes: in a condition that the first search bit has the first logic value and the first data bit has the second logic value, when the first string select line signal has the second voltage level, turning on each of the first switch element, the second switch element and the third switch element.

In some embodiment, comparing the first search bit and the first data bit further includes: in the condition that the first search bit has the first logic value and the first data bit has the second logic value, when the first string select line signal has the first voltage level, turning off each of the first switch element and the second switch element, and turning on the third switch element.

In some embodiment, comparing the first search bit and the first data bit includes: in a condition that the first search bit has the second logic value and the first data bit has the first logic value, when the first string select line signal has the second voltage level, turning on each of the first switch element, the second switch element and the third switch element.

In some embodiment, comparing the first search bit and the first data bit further includes: in the condition that the first search bit has the second logic value and the first data bit has the first logic value, when the first string select line signal has the first voltage level, turning off each of the first switch element and the third switch element, and turning on the second switch element.

In some embodiment, comparing the first search bit and the first data bit includes: in a condition that each of the first search bit and the first data bit has the first logic value, when the first string select line signal has the second voltage level, turning on each of the first switch element and the second switch element, and turning off the third switch element.

In some embodiment, comparing the first search bit and the first data bit further includes: in the condition that each of the first search bit and the first data bit has the first logic value, when the first string select line signal has the first voltage level, turning off the first switch element, and turning on each of the second switch element and the third switch element.

In some embodiment, comparing the first search bit and the first data bit includes: in a condition that each of the first search bit and the first data bit has the second logic value, when the first string select line signal has the second voltage level, turning on each of the first switch element and the third switch element, and turning off the second switch element.

In some embodiment, comparing the first search bit and the first data bit further includes: in the condition that each of the first search bit and the first data bit has the second logic value, when the first string select line signal has the first voltage level, turning off the first switch element, and turning on each of the second switch element and the third switch element.

The present disclosure provides a memory device. The memory device includes a first switch element and a second switch element. The first switch element is configured to output a first current signal at a node according to a first string select line signal. The second switch element configured to output a second current signal at the node according to a second string select line signal. In response to the first string select line signal carrying a first logic value, the first switch element is turned off and turned on in order, and in response to the second string select line signal carrying a second logic value, the second switch element is turned on and turned off in order.

In some embodiment, the memory device further includes: a third switch element coupled to the first switch element, and configured to receive a first word line signal; a fourth switch element coupled to the third switch element, and configured to receive a second word line signal; a fifth switch element coupled to the second switch element, and configured to receive a third word line signal; and a sixth switch element coupled to the fifth switch element, and configured to receive a fourth word line signal. Each of the first word line signal and the third word line signal has a read voltage level and a pass voltage level in order, each of the second word line signal and the fourth word line signal has the pass voltage level and the read voltage level in order, and the read voltage level is smaller than the pass voltage level.

In some embodiment, in response to the third switch element and the fourth switch element storing the second logic value and the first string select line signal carrying the first logic value, when the first switch element is turned on, the second word line signal has the read voltage level and each of the third switch element and the fourth switch element is turned on.

In some embodiment, in response to the fifth switch element and the sixth switch element storing the first logic value and the second string select line signal carrying the second logic value, when the second switch element is turned on, the third word line signal has the read voltage level and each of the fifth switch element and the sixth switch element is turned on.

In some embodiment, in response to the fifth switch element and the sixth switch element storing the first logic value and the second string select line signal carrying the second logic value, when the second switch element is turned off, the fourth word line signal has the read voltage level and the sixth switch element is turned off.

In some embodiment, in response to the third switch element and the fourth switch element storing the second logic value and the second string select line signal carrying the first logic value, when the first switch element is turned off, the second word line signal has the read voltage level and the third switch element is turned off.

In some embodiment, the memory device further includes: a seventh switch element coupled to the fourth switch element, and configured to receive a fifth word line signal. When each of the first word line signal and the second word line signal has the pass voltage level, the fifth word line signal has the read voltage level and the pass voltage level in order.

In some embodiment, the memory device further includes: an eighth switch element coupled to the seventh switch element, and configured to receive a sixth word line signal. When each of the first word line signal and the second word line signal has the pass voltage level, the sixth word line signal the pass voltage level and the read voltage level in order.

The present disclosure provides a memory device. The memory device includes: a first memory column configured to generate a first current signal according to a string select line signal; and a second memory column configured to generate a second current signal according to the string select line signal. In response to each of the first memory column and the second memory column storing a first logic value and the string select line signal carrying the first logic value, each of the first current signal and the second current signal has a first current level and a second current level in order, and the second current level is lower than the first current level.

In some embodiments, the memory device further includes: a third memory column configured to generate a third current signal according to the string select line signal. In response to the third memory column storing a second logic value and the string select line signal carrying the first logic value, the third current signal is maintained at the second current level when the first current signal is changed from the first current level to the second current level.

It is to be understood that both the foregoing general description and the following detailed description are examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a schematic diagram of various conditions of the part of the memory device performing the search operation, illustrated according to some embodiments of present disclosure.

DETAILED DESCRIPTION

Figure 1:
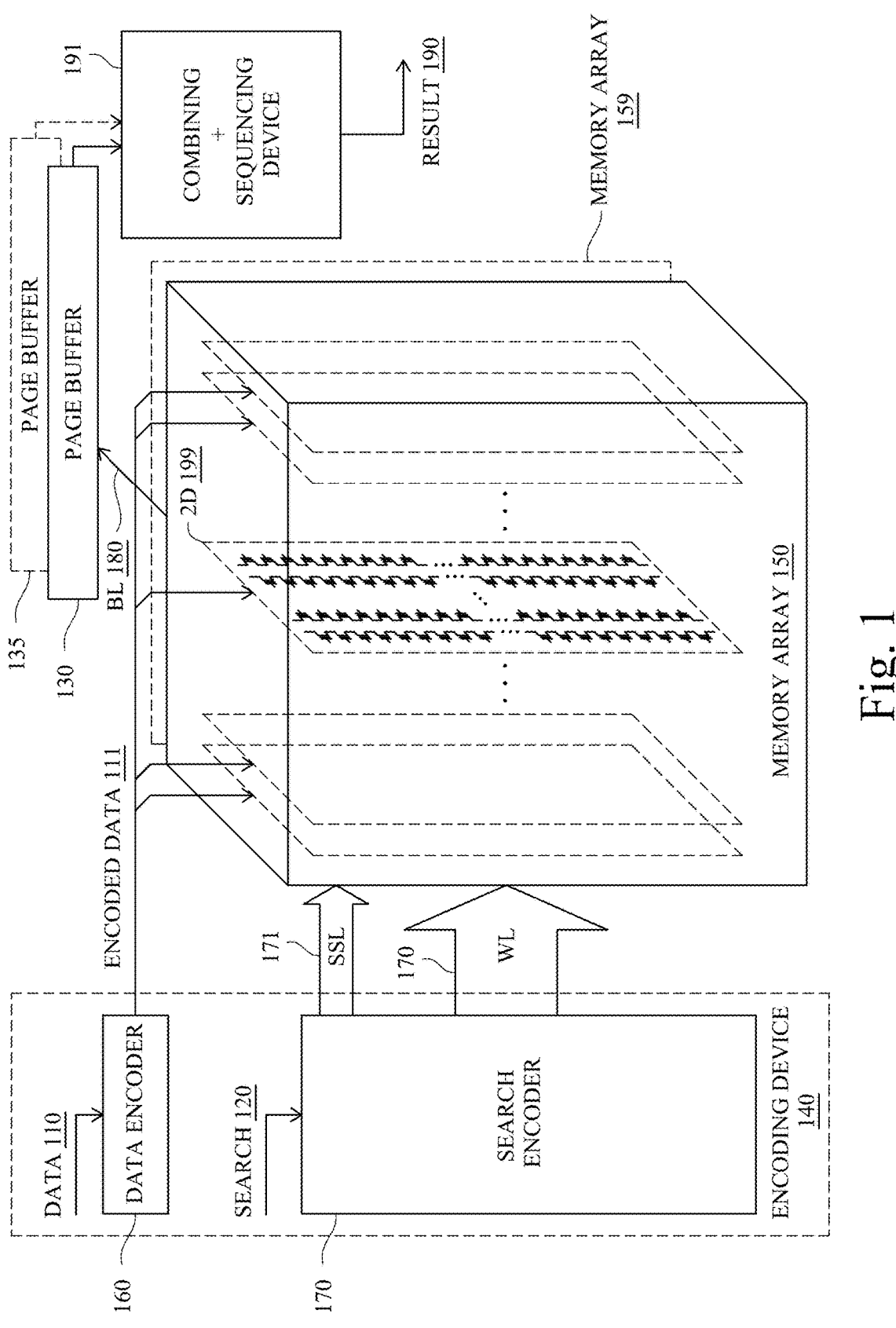
FIG. 1 is a schematic diagram of a memory system illustrated according to some embodiments of present disclosure.

In the present disclosure, when an element is referred to as "connected" or "coupled", it may mean "electrically connected" or "electrically coupled". "Connected" or "coupled" can also be used to indicate that two or more components operate or interact with each other. In addition, although the terms "first", "second", and the like are used in the present disclosure to describe different elements, the terms are used only to distinguish the elements or operations described in the same technical terms. The use of the term is not intended to be a limitation of the present disclosure.

Unless otherwise defined, all terms (including technical and scientific terms) used in the present disclosure have the same meaning as commonly understood by the ordinary skilled person to which the concept of the present invention belongs. It will be further understood that terms (such as those defined in commonly used dictionaries) should be interpreted as having a meaning consistent with its meaning in the related technology and/or the context of this specification and not it should be interpreted in an idealized or overly formal sense, unless it is clearly defined as such in this article.

The terms used in the present disclosure are only used for the purpose of describing specific embodiments and are not intended to limit the embodiments. As used in the present disclosure, the singular forms "a", "one" and "the" are also intended to include plural forms, unless the context clearly indicates otherwise. It will be further understood that when used in this specification, the terms "comprises (comprising)" and/or "includes (including)" designate the existence of stated features, steps, operations, elements and/or components, but the existence or addition of one or more other features, steps, operations, elements, components, and/or groups thereof are not excluded.

Hereinafter multiple embodiments of the present disclosure will be disclosed with schema, as clearly stated, the details in many practices it will be explained in the following description. It should be appreciated, however, that the details in these practices is not applied to limit the present disclosure. Also, it is to say, in some embodiments of the present disclosure, the details in these practices are non-essential. In addition, for the sake of simplifying schema, some known usual structures and element in the drawings by a manner of simply illustrating for it.

FIG. 1 is a schematic diagram of a memory system 100A illustrated according to some embodiments of present disclosure. In some embodiments, the memory system 100A can be implemented by a 3D NAND in-memory search system. As shown in FIG. 1, the memory system 100A includes an encoding device 140, memory arrays 150, 159, page buffers 130, 135 and combining/sequencing device 191. The encoding device 140 can includes a data encoder 160 and a search encoder 170. The memory array can include multiple 2D memory arrays 199.

In some embodiments, the data encoder 160 is configured receive data signals 110 and generate encoded data signals 111. The search encoder 170 is configured to receive search signals 120 and generate string select line (SSL) signals 171 and word line (WL) signals 172. The memory array 150 is configured to receive the encoded data signals 111, the string select line signals 171 and word line signals 172, and generate bit line (BL) signals 180. The page buffer 130 is configured to process outputs of the bit line signals 180 to generate search results 190 and output to the combining/sequencing device 191. The combining/sequencing device 191 is configured to process the output of the bit line signals 180 to generate the search results 190.

In some embodiments, the process performed by the combining/sequencing device 191 to the bit line signals 180 includes logic processes of AND logic, OR logic or counting, and also may include combining processes of the three logic processes described above. Referring to FIG. 1 to FIG. 4A, the combining/sequencing device 191 can receive sense results from the memory devices 200, 300 and 400, and controls sequencing (whether serial or parallel) and combines sense results to produce overall search results as the search results 190.

In some embodiments, the memory system 100A can be implemented on a single integrated circuit die, multiple integrated circuits, or be implemented as a component of a system-on-a-chip (SOC). As a specific example, the memory system 100A is implemented on a single integrated circuit die, and can perform searching and combining logic operations in the single integrated circuit die.

In some embodiments, the memory cells in the 3D memory array 150 can be referred to as in-memory searching (IMS) cells. The IMS cells can be implemented by floating gate memory, split-gate memory, silicon-oxide-nitride-oxide-silicon (SONOS) memory, floating dot memory, dynamic random-access memory (DRAM) and/or other devices similar with DRAM, such as 2TOC memory. In some embodiments, the memory cell can also be implemented by emerging memory, such as ferroelectric field-effect transistor (FeFET). In various embodiments, the memory system 100A can be implemented by 2D flash structure or 3D flash structure.

Figure 2A:
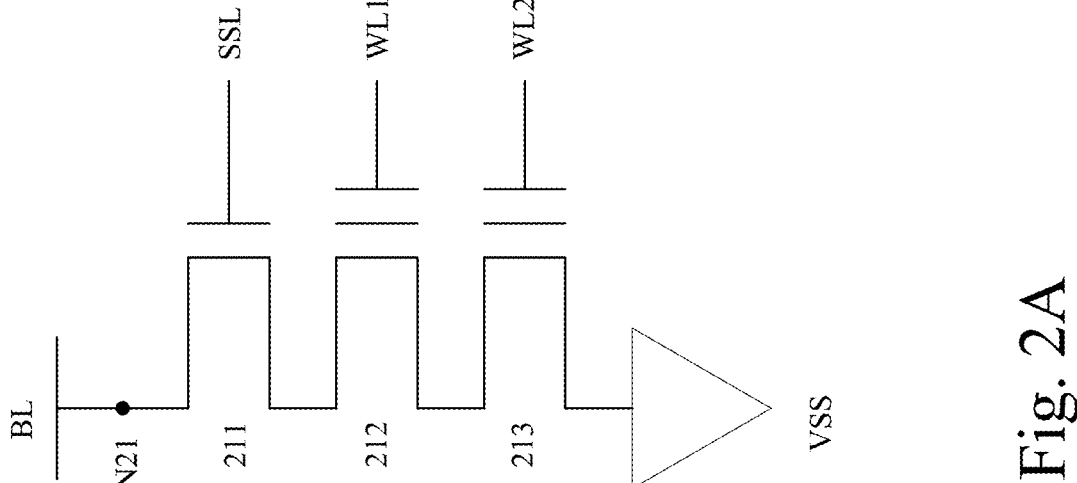
FIG. 2A is a schematic diagram of a part of a memory device illustrated according to some embodiments of present disclosure.

FIG. 2A is a schematic diagram of a part of a memory device 200 illustrated according to some embodiments of present disclosure. Referring to FIG. 1 and FIG. 2A, the memory device 200 can be an embodiment of the memory array 150. As shown in FIG. 2A, the memory device 200 at least includes switch elements 211-213. In various embodiments, memory device 200 can includes more switch elements.

In some embodiments, the switch elements 211-213 are configured to generate a bit line signal BL at a node N21. In some embodiments, the switch element 211 can be implemented by a transistor, and switch elements 212-213 can be implemented by elements having charge trap, such as flash units.

As shown in FIG. 2A, a terminal of the switch element 211 is coupled to the node N21, another terminal of the switch element 211 is coupled to the switch element 212, and a control terminal of the switch element 211 is configured to receive a string select line signal SSL. A terminal of the switch element 212 is coupled to the switch element 211, another terminal of the switch element 212 is coupled to the switch element 213, and a control terminal of the switch element 212 is configured to receive a word line signal WL1. A terminal of the switch element 213 is coupled to the switch element 212, another terminal of the switch element 213 is configured to receive a, and a control terminal of the switch element 213 is configured to receive a word line signal WL2.

In some embodiments, the switch elements 212 and 213 are configured to store a stored data bit DT1, and the string select line signal SSL is configured to carry a search bit SB1. When the stored data bit DT1 has a logic value 1, the switch element 212 has a threshold voltage level LVT and the switch element 213 has a threshold voltage level HVT. When the stored data bit DT1 has a logic value 0, the switch element 212 has a threshold voltage level HVT and the switch element 213 has a threshold voltage level LVT. When the stored data bit DT1 has a "don't care" logic value, each of the switch elements 212 and 213 has the threshold voltage level HVT.

In some embodiments, the threshold voltage level HVT is larger than the threshold voltage level LVT. When a switch element has the threshold voltage level HVT, the switch element is turned on in response to a pass voltage level VPASS and is turned off in response to a read voltage level VREAD. When a switch element has the threshold voltage level LVT, the switch element is turned on in response to each of the pass voltage level VPASS and the read voltage level VREAD. In some embodiments, the pass voltage level VPASS is larger than the read voltage level VREAD.

In some embodiments, when the search bit SB1 has the logic value 0, the string select line signal SSL has voltage levels VL and VH in order. When the search bit SB1 has the logic value 1, the string select line signal SSL has the voltage levels VH and VL in order. When the search bit SB1 has a wildcard logic value, the string select line signal SSL is maintained at the voltage level VL. In some embodiments, the voltage level VH is larger than the voltage level VL.

In some embodiments, the memory device 200 can perform a search operation to compare the stored data bit DT1 and the search bit SB1. Details associated with the search operation are further described below with the embodiments associated with FIG. 2B.

Figure 2B:
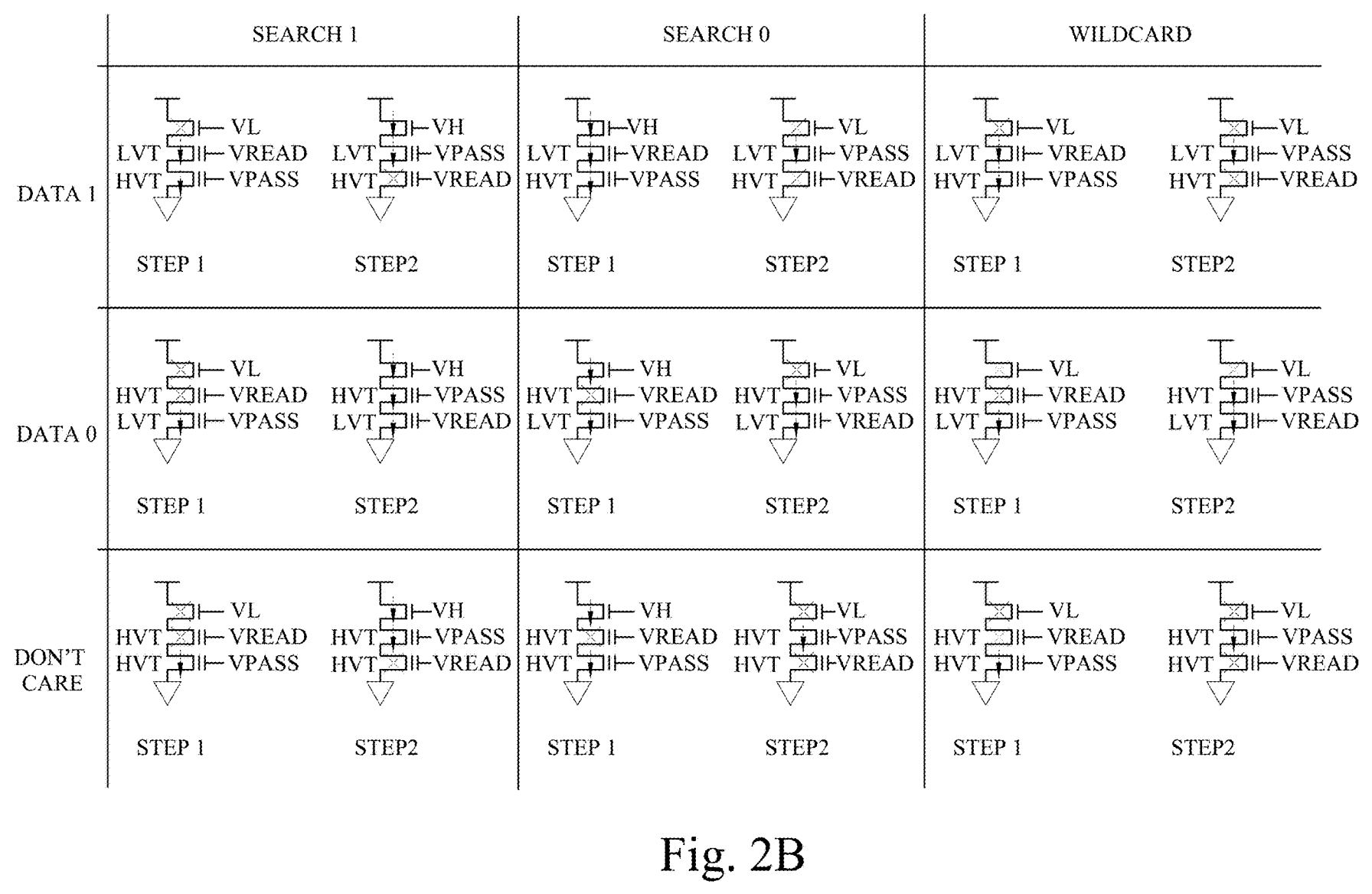

FIG. 2B is a schematic diagram of various conditions of the part of the memory device 200 performing the search operation, illustrated according to some embodiments of present disclosure. As shown in FIG. 2B, the memory device 200 can be operated in nine conditions. The nine conditions are arranged in three columns and three rows. Referring to FIG. 2A and FIG. 2B, for brevity, labels of the memory device 200, such as the labels of the switch elements 211-213, the bit line signal BL, the node N21, the string select line signal SSL, the reference voltage signal VSS and the word line signals WL1-WL2 are not shown in FIG. 2B.

In the conditions of the first column, the search bit SB1 has the logic value 1. In the conditions of the second column, the search bit SB1 has the logic value 0. In the conditions of the third column, the search bit SB1 has the wildcard logic value. In some embodiments, the wildcard logic value is referred to as an arbitrary logic value during inputting.

In the conditions of the first row, the stored data bit DT1 has the logic value 1. In the conditions of the second row, the stored data bit DT1 has the logic value 0. In the conditions of the third row, the stored data bit DT1 has the "don't care" logic value. In some embodiments, the "don't care" logic value is referred to as an arbitrary logic value during storing.

Each condition of the nine conditions includes a first step (referred to as step 1 following) and a second step (referred to as step 2 following) performed in order. In some embodiments, the memory device 200 can determine whether the stored data bit DT1 and the search bit SB1 are match according to the current levels of the bit line signal BL during the step 1 and step 2. When the stored data bit DT1 and the search bit SB1 are match, a logic value of the stored data bit DT1 and a logic value of the search bit SB1 are the same. When the stored data bit DT1 and the search bit SB1 are mismatch, the logic value of the stored data bit DT1 and the logic value of the search bit SB1 are different from each other.

In the step 1 of the condition of the first column and the first row, the string select line signal SSL has the voltage level VL, such that the switch element 211 is turned off. The switch elements 212 and 213 have the threshold voltage levels LVT and HVT, respectively. The word line signal WL1 and WL2 have the read voltage level VREAD and the pass voltage level VPASS, respectively, such that each of the switch elements 212 and 213 are turned on. Correspondingly, the bit line signal BL has a current level IL. In some embodiments, the current level IL is the zero current level.

Then, in the step 2 of the condition of the first column and the first row, the string select line signal SSL has the voltage level VH, such that the switch element 211 is turned on. The switch elements 212 and 213 have the threshold voltage levels LVT and HVT, respectively. The word line signal WL1 and WL2 have the pass voltage level VPASS and the read voltage level VREAD, respectively, such that the switch element 212 is turned on and the switch element 212 is turned off. Correspondingly, the bit line signal BL has the current level IL.

Referring to FIG. 1 and FIG. 2B, the page buffer 130 in the memory system 100A can sum the current levels of the bit line signal BL during the step 1 and the step 2, and determine whether the stored data bit DT1 and the search bit SB1 are match according to the summation result. In the condition of the first column and the first row, the summation result of the bit line signal BL is the current level IL+IL, such that the memory system 100A can determine the stored data bit DT1 and the search bit SB1 are match.

In the step 1 of the condition of the first column and the second row, the string select line signal SSL has the voltage level VL, such that the switch element 211 is turned off. The switch elements 212 and 213 have the threshold voltage levels HVT and LVT, respectively. The word line signal WL1 and WL2 have the read voltage level VREAD and the pass voltage level VPASS, respectively, such that the switch element 213 is turned on and the switch element 212 is turned off. Correspondingly, the bit line signal BL has the current level IL.

Then, in the step 2 of the condition of the first column and the second row, the string select line signal SSL has the voltage level VH, such that the switch element 211 is turned on. The switch elements 212 and 213 have the threshold voltage levels HVT and LVT, respectively. The word line signal WL1 and WL2 have the pass voltage level VPASS and the read voltage level VREAD, respectively, such that each of the switch elements 212 and 213 is turned on. Correspondingly, the bit line signal BL has a current level IH. In some embodiments, the current level IH is larger than the current level IL.

In the condition of the first column and the second row, the summation result of the bit line signal BL is the current level IL+IH, such that the memory system 100A can determine the stored data bit DT1 and the search bit SB1 are mismatch.

In the step 1 of the condition of the first column and the third row, the string select line signal SSL has the voltage level VL, such that the switch element 211 is turned off. Each of the switch elements 212 and 213 has the threshold voltage level HVT. The word line signal WL1 and WL2 have the read voltage level VREAD and the pass voltage level VPASS, respectively, such that the switch element 213 is turned on and the switch element 212 is turned off. Correspondingly, the bit line signal BL has the current level IL.

Then, in the step 2 of the condition of the first column and the third row, the string select line signal SSL has the voltage level VH, such that the switch element 211 is turned on. Each of the switch elements 212 and 213 has the threshold voltage level HVT. The word line signal WL1 and WL2 have the pass voltage level VPASS and the read voltage level VREAD, respectively, such that the switch element 212 is turned on and the switch element 213 is turned off. Correspondingly, the bit line signal BL has the current level IL.

In the condition of the first column and the third row, the summation result of the bit line signal BL is the current level IL+IL, such that the memory system 100A can determine the stored data bit DT1 and the search bit SB1 are match.

In the step 1 of the condition of the second column and the first row, the string select line signal SSL has the voltage level VH, such that the switch element 211 is turned on. The switch elements 212 and 213 have the threshold voltage levels LVT and HVT, respectively. The word line signal WL1 and WL2 have the read voltage level VREAD and the pass voltage level VPASS, respectively, such that each of the switch elements 212 and 213 is turned on. Correspondingly, the bit line signal BL has the current level IH.

Then, in the step 2 of the condition of the second column and the first row, the string select line signal SSL has the voltage level VL, such that the switch element 211 is turned off. The switch elements 212 and 213 have the threshold voltage levels LVT and HVT. The word line signal WL1 and WL2 have the pass voltage level VPASS and the read voltage level VREAD, respectively, such that the switch element 212 is turned on and the switch element 213 is turned off. Correspondingly, the bit line signal BL has the current level IL.

In the condition of the second column and the first row, the summation result of the bit line signal BL is the current level IH+IL, such that the memory system 100A can determine the stored data bit DT1 and the search bit SB1 are mismatch.

In the step 1 of the condition of the second column and the second row, the string select line signal SSL has the voltage level VH, such that the switch element 211 is turned on. The switch elements 212 and 213 have the threshold voltage levels HVT and LVT, respectively. The word line signal WL1 and WL2 have the read voltage level VREAD and the pass voltage level VPASS, respectively, such that the switch element 213 is turned on and the switch element 212 is turned off. Correspondingly, the bit line signal BL has the current level IL.

Then, in the step 2 of the condition of the second column and the second row, the string select line signal SSL has the voltage level VL, such that the switch element 211 is turned off. The switch elements 212 and 213 have the threshold voltage levels HVT and LVT, respectively. The word line signal WL1 and WL2 have the pass voltage level VPASS and the read voltage level VREAD, respectively, such that each of the switch elements 212 and 213 is turned on. Correspondingly, the bit line signal BL has the current level IL.

In the condition of the second column and the second row, the summation result of the bit line signal BL is the current level IL+IL, such that the memory system 100A can determine the stored data bit DT1 and the search bit SB1 are match.

In the step 1 of the condition of the second column and the third row, the string select line signal SSL has the voltage level VH, such that the switch element 211 is turned on. Each of the switch elements 212 and 213 has the threshold voltage level HVT. The word line signal WL1 and WL2 have the read voltage level VREAD and the pass voltage level VPASS, respectively, such that the switch element 213 is turned on and the switch element 212 is turned off. Correspondingly, the bit line signal BL has the current level IL.

Then, in the step 2 of the condition of the second column and the third row, the string select line signal SSL has the voltage level VL, such that the switch element 211 is turned off. Each of the switch elements 212 and 213 has the threshold voltage level HVT. The word line signal WL1 and WL2 have the pass voltage level VPASS and the read voltage level VREAD, respectively, such that the switch element 212 is turned on and the switch element 213 is turned off. Correspondingly, the bit line signal BL has the current level IL.

In the condition of the second column and the third row, the summation result of the bit line signal BL is the current level IL+IL, such that the memory system 100A can determine the stored data bit DT1 and the search bit SB1 are match.

In the step 1 of the condition of the third column and the first row, the string select line signal SSL has the voltage level VL, such that the switch element 211 is turned off. The switch elements 212 and 213 have the threshold voltage levels LVT and HVT, respectively. The word line signal WL1 and WL2 have the read voltage level VREAD and the pass voltage level VPASS, respectively, such that each of the switch elements 212 and 213 is turned on. Correspondingly, the bit line signal BL has the current level IL.

Then, in the step 2 of the condition of the third column and the first row, the string select line signal SSL has the voltage level VL, such that the switch element 211 is turned off. The switch elements 212 and 213 have the threshold voltage levels LVT and HVT. The word line signal WL1 and WL2 have the pass voltage level VPASS and the read voltage level VREAD, respectively, such that the switch element 212 is turned on and the switch element 213 is turned off. Correspondingly, the bit line signal BL has the current level IL.

In the condition of the third column and the first row, the summation result of the bit line signal BL is the current level IL+IL, such that the memory system 100A can determine the stored data bit DT1 and the search bit SB1 are match.

In the step 1 of the condition of the third column and the second row, the string select line signal SSL has the voltage level VL, such that the switch element 211 is turned off. The switch elements 212 and 213 have the threshold voltage levels HVT and LVT, respectively. The word line signal WL1 and WL2 have the read voltage level VREAD and the pass voltage level VPASS, respectively, such that the switch element 213 is turned on and the switch element 212 is turned off. Correspondingly, the bit line signal BL has the current level IL.

Then, in the step 2 of the condition of the third column and the second row, the string select line signal SSL has the voltage level VL, such that the switch element 211 is turned off. The switch elements 212 and 213 have the threshold voltage levels HVT and LVT, respectively. The word line signal WL1 and WL2 have the pass voltage level VPASS and the read voltage level VREAD, respectively, such that each of the switch elements 212 and 213 is turned on. Correspondingly, the bit line signal BL has the current level IL.

In the condition of the third column and the second row, the summation result of the bit line signal BL is the current level IL+IL, such that the memory system 100A can determine the stored data bit DT1 and the search bit SB1 are match.

In the step 1 of the condition of the third column and the third row, the string select line signal SSL has the voltage level VL, such that the switch element 211 is turned off. Each of the switch elements 212 and 213 has the threshold voltage level HVT. The word line signal WL1 and WL2 have the read voltage level VREAD and the pass voltage level VPASS, respectively, such that the switch element 213 is turned on and the switch element 212 is turned off. Correspondingly, the bit line signal BL has the current level IL.

Then, in the step 2 of the condition of the third column and the third row, the string select line signal SSL has the voltage level VL, such that the switch element 211 is turned off. Each of the switch elements 212 and 213 has the threshold voltage level HVT. The word line signal WL1 and WL2 have the pass voltage level VPASS and the read voltage level VREAD, respectively, such that the switch element 212 is turned on and the switch element 213 is turned off. Correspondingly, the bit line signal BL has the current level IL.

In the condition of the third column and the third row, the summation result of the bit line signal BL is the current level IL+IL, such that the memory system 100A can determine the stored data bit DT1 and the search bit SB1 are match.

In some approaches, for performing in-memory search, word line signals carry search data to compare with store data stored by the memory cells, to determine whether the search data and the store data are match. However, in the approaches described above, two word line signals are required to carry one search bit, such that a length of the search data is shorter.

Compared to above approaches, in the embodiments of present disclosure, the memory device 200 uses tunable non-paired string select line signal SSL to carry search data. The string select line signal SSL is adjusted between the voltage levels VH and VL, to correspond to logic value 0 or logic value 1. As a result, a single string select line signal SSL is used to carry one search bit SB1, such that the length of the search data can be double. Furthermore, according to the condition of the first column and the second row and the condition of the second column and the first row shown in FIG. 2B, the memory device 200 can distinguish the mismatch condition that the logic value of the search bit SB1 is 1 and the logic value of the stored data bit DT1 is 0 and the mismatch condition that the logic value of the search bit SB1 is 0 and the logic value of the stored data bit DT1 is 1.

Figure 3A:
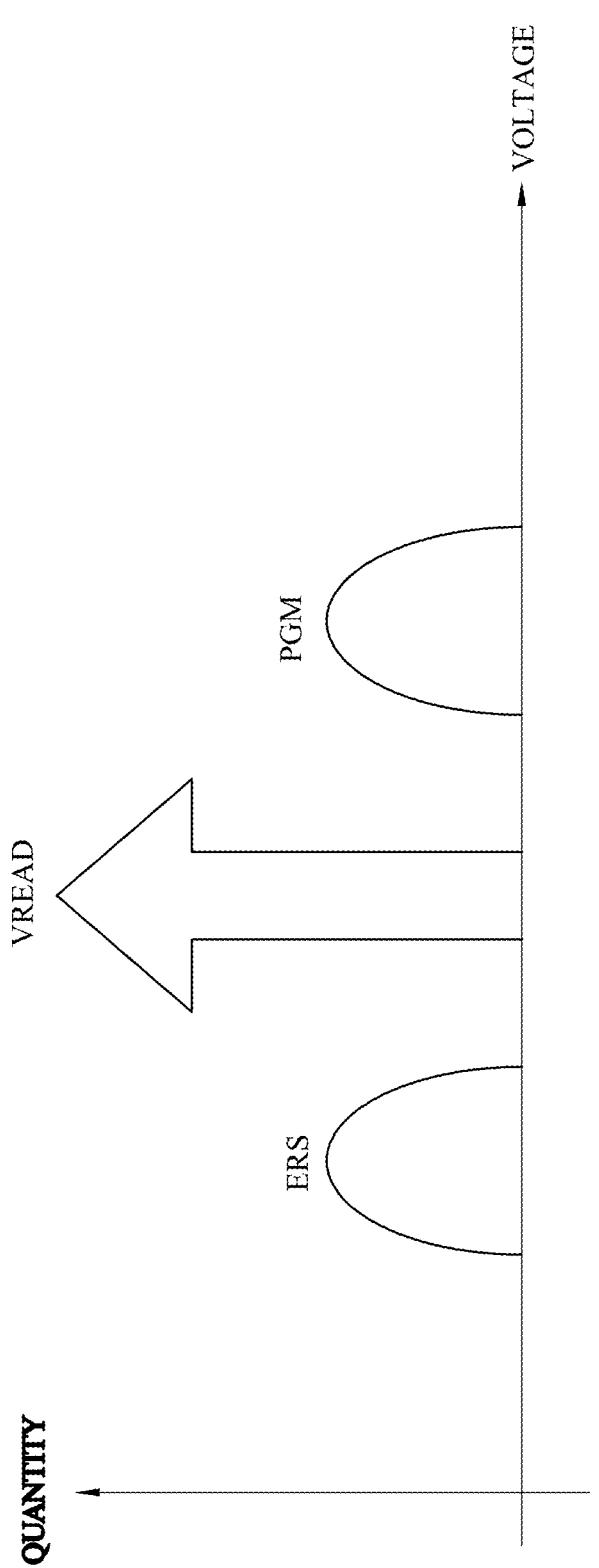
FIG. 3A is a schematic diagram of a threshold voltage level distribution of the switch elements, illustrated according to some embodiments of present disclosure.

FIG. 3A is a schematic diagram of a threshold voltage level distribution of the switch elements, illustrated according to some embodiments of present disclosure. The horizontal axis in FIG. 3A corresponds to voltage, and the vertical axis corresponds to amount.

As shown in FIG. 3A, the switch elements can have a program state PGM or an erase state ERS. Voltage levels corresponding to the program state PGM are larger, and voltage levels corresponding to the erase state ERS are smaller. The read voltage level VREAD is between the voltage levels corresponding to the program state PGM and the voltage levels corresponding to the erase state ERS.

Referring to FIG. 3A and FIG. 2B, the program state PGM and the erase state ERS correspond to the threshold voltage levels HVT and LVT, respectively. For example, when one of the switch elements 212 and 213 is the program state PGM, the one of the switch elements 212 and 213 has the threshold voltage level HVT. When one of the switch elements 212 and 213 is the erase state ERS, the one of the switch elements 212 and 213 has the threshold voltage level LVT.

Figure 3B:
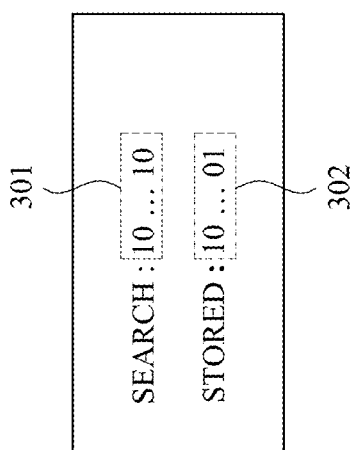
FIG. 3B is a schematic diagram of store data and search data associated with the memory device, illustrated according to some embodiments of present disclosure.

FIG. 3B is a schematic diagram of store data 302 and search data 301 associated with the memory device, illustrated according to some embodiments of present disclosure. As shown in FIG. 3B, each of the store data 302 and the search data 301 includes multiple logic values.

In the embodiment shown in FIG. 3B, the first logic value, the second logic value, the second last logic value and the first last logic value of the search data 301 are 1, 0, 1 and 0, respectively. The first logic value, the second logic value, the second last logic value and the first last logic value of the search data 302 are 1, 0, 0 and 1, respectively.

In some embodiments, the Hamming distance between the search data 301 and the store data 302. Alternatively stated, there are only two different logic values between the search data 301 and the store data 302, other logic values are the same. In the embodiment shown in FIG. 3B, there are only the last two different logic values between the search data 301 and the store data 302.

Figure 3C:
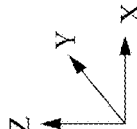
FIG. 3C is a schematic diagram of a part of a memory device performing the first step of the search operation, illustrated according to some embodiments of present disclosure.

FIG. 3C is a schematic diagram of a part of a memory device 300 performing the step 1 of the search operation, illustrated according to some embodiments of present disclosure. Referring to FIG. 1 and FIG. 3C, the memory device 300 can be an embodiment of the memory array 150.

As shown in FIG. 3C, the memory device 300 includes memory columns CL1-CL512. However, the embodiments of present disclosure are not limited to this. In various embodiments, the memory device 300 can include various quantities of memory columns.

In some embodiments, the memory columns CL1-CL512 are coupled in parallel with each other between nodes N31 and N32, and are configured to output a bit line signal BL(M) at the node N31. The memory columns CL1-CL512 are configured to generate current signals 11-1512, and sum the current signals 11-1512 at the node N31 to generate the bit line signal BL(M). It is noted that M is a positive integer, such as 128K, in which K represents one thousand.

In some embodiments, the memory columns CL1-CL512 are arranged along the Y direction. Each of the memory columns CL1-CL512 includes multiple switch elements arranged along the Z direction. In some embodiments, the memory device 300 further includes other memory columns arranged along the X direction (not shown in figures). In some embodiments, the X direction, the Y direction and the Z direction are perpendicular to each other.

As shown in FIG. 3C, the memory column CL1 includes switch elements TS1, FC1_1-FCN_1, TG1 and TC1 coupled in series between the nodes N31 and N32, in which N of the switch element FCN_1 is a positive integer. Specifically, a first terminal of the switch element TS1 is coupled to the node N31, and a second terminal of the switch element TS1 is coupled to a first terminal of the switch element FC1_1. A second terminal of the switch element FC1_1 is coupled to a first terminal of the switch element FC2_1, and so on. A second terminal of the switch element FC(N−1)_1 is coupled to a first terminal of the switch element FCN_1. A second terminal of the switch element FCN_1 is coupled to a first terminal of the switch element TG1. A second terminal of the switch element TG1 is coupled to a first terminal of the switch element TC1. A second terminal of the switch element TC1 is coupled to the node N32.

In some embodiments, the switch element TS1 is configured to output the current signal 11 at the node N31. The switch element TC1 is configured to receive the reference voltage signal VSS at the node N32. A control terminal of the switch element TS1 is configured to receive a string select line signal SSL1. Control terminals of the switch elements FC1_1-FCN_1 are configured to receive word line signals WL1_1-WLN_1, respectively. A control terminal of the switch element TG1 is configured to receive a ground select line signal GSL. A control terminal of the switch element TC1 is configured to receive a control select line signal CSL.

As shown in FIG. 3C, the memory column CL2 includes switch elements TS2, FC1_2-FCN_2, TG2 and TC2 coupled in series between the nodes N31 and N32. Specifically, a first terminal of the switch element TS2 is coupled to the node N31, and a second terminal of the switch element TS2 is coupled to a first terminal of the switch element FC1_2. A second terminal of the switch element FC1_2 is coupled to a first terminal of the switch element FC2_2, and so on. A second terminal of the switch element FC(N−1)_2 is coupled to a first terminal of the switch element FCN_2. A second terminal of the switch element FCN_2 is coupled to a first terminal of the switch element TG2. A second terminal of the switch element TG2 is coupled to a first terminal of the switch element TC2. A second terminal of the switch element TC2 is coupled to the node N32.

In some embodiments, the switch element TS2 is configured to output the current signal 12 at the node N31. The switch element TC2 is configured to receive the reference voltage signal VSS at the node N32. A control terminal of the switch element TS2 is configured to receive a string select line signal SSL2. Control terminals of the switch elements FC1_2-FCN_2 are configured to receive word line signals WL1_2-WLN_2, respectively. A control terminal of the switch element TG2 is configured to receive the ground select line signal GSL. A control terminal of the switch element TC2 is configured to receive the control select line signal CSL, and so on.

As shown in FIG. 3C, the memory column CL511 includes switch elements TS511, FC1_511-FCN_511, TG511 and TC511 coupled in series between the nodes N31 and N32. Specifically, a first terminal of the switch element TS511 is coupled to the node N31, and a second terminal of the switch element TS511 is coupled to a first terminal of the switch element FC1_511. A second terminal of the switch element FC1_511 is coupled to a first terminal of the switch element FC2_511, and so on. A second terminal of the switch element FC(N−1)_511 is coupled to a first terminal of the switch element FCN_511. A second terminal of the switch element FCN_511 is coupled to a first terminal of the switch element TG511. A second terminal of the switch element TG511 is coupled to a first terminal of the switch element TC511. A second terminal of the switch element TC511 is coupled to the node N3511.

In some embodiments, the switch element TS511 is configured to output the current signal I511 at the node N31. The switch element TC511 is configured to receive the reference voltage signal VSS at the node N32. A control terminal of the switch element TS511 is configured to receive a string select line signal SSL511. Control terminals of the switch elements FC1_511-FCN_511 are configured to receive word line signals WL1_511-WLN_511, respectively. A control terminal of the switch element TG511 is configured to receive the ground select line signal GSL. A control terminal of the switch element TC511 is configured to receive the control select line signal CSL.

As shown in FIG. 3C, the memory column CL512 includes switch elements TS512, FC1_512-FCN_512, TG512 and TC512 coupled in series between the nodes N31 and N32. Specifically, a first terminal of the switch element TS512 is coupled to the node N31, and a second terminal of the switch element TS512 is coupled to a first terminal of the switch element FC1_512. A second terminal of the switch element FC1_512 is coupled to a first terminal of the switch element FC2_512, and so on. A second terminal of the switch element FC(N−1)_512 is coupled to a first terminal of the switch element FCN_512. A second terminal of the switch element FCN_512 is coupled to a first terminal of the switch element TG512. A second terminal of the switch element TG512 is coupled to a first terminal of the switch element TC512. A second terminal of the switch element TC512 is coupled to the node N3512.

In some embodiments, the switch element TS512 is configured to output the current signal I512 at the node N31. The switch element TC512 is configured to receive the reference voltage signal VSS at the node N32. A control terminal of the switch element TS512 is configured to receive a string select line signal SSL512. Control terminals of the switch elements FC1_512-FCN_512 are configured to receive word line signals WL1_512-WLN_512, respectively. A control terminal of the switch element TG512 is configured to receive the ground select line signal GSL. A control terminal of the switch element TC512 is configured to receive the control select line signal CSL.

As shown in FIG. 3C, the switch elements FC1_1 and FC2_1 can operate as a memory cell MC1. The switch elements FC1_2 and FC2_2 can operate as a memory cell MC2, and so on. The switch elements FC1_511 and FC2_511 can operate as a memory cell MC511. The switch elements FC1_512 and FC2_512 can operate as a memory cell MC512.

Referring to FIG. 3C and FIG. 3B, a quantity of the logic values of the store data 302 can be 512, and the memory cells MC1-MC512 are configured to store the 512 logic values, respectively. Specifically, the memory cells MC1, MC2, MC511 and MC512 are configured to store logic values 1, 0, 0 and 1, respectively.

Correspondingly, each of the switch elements FC1_1, FC2_2, FC2_511 and FC1_512 has the erase state ERS, and each of the switch elements FC2_1, FC1_2, FC1_511 and FC2_512 has the program state PGM. Alternatively stated, each of the switch elements FC1_1, FC2_2, FC2_511 and FC1_512 has the threshold voltage level LVT, and each of the switch elements FC2_1, FC1_2, FC1_511 and FC2_512 has the threshold voltage level HVT.

On the other hand, a quantity of the logic values of the search data 302 can also be 512, and the string select line signals SSL1-SSL512 are configured to carry the 512 logic values of the search data 302, respectively. Specifically, the string select line signals SSL1, SSL2, SSL511 and SSL512 carry the logic values 1, 0, 1 and 0, respectively.

In some embodiments, when the search operation is performed to the memory cells MC1-MC512, the word line signals WL3_1-WLN_1, WL3_2-WLN_2, . . . , WL3_511-WLN_511 and WL3_512-WLN_512 has the pass voltage level VPASS, such that the switch elements FC3_1-FCN_1, FC3_2-FCN_2, . . . , FC3_511-FCN_511 and FC3_512-FCN_512 are turned on.

In some embodiments, the search operation performed to the memory cells MC1-MC512 includes step 1 and step 2 performed in order. The condition shown in FIG. 3C corresponds to the step 1. During the step 1, the memory device 300 is configured to find a mismatch condition that the logic value of the search data 301 being 0 and the corresponding logic value of the store data 302 being 1.

During the step 1, in response to the string select line signals SSL1, SSL2, SSL511 and SSL512 carrying the logic values 1, 0, 1 and 0, respectively, the string select line signals SSL1, SSL2, SSL511 and SSL512 have the voltage levels VL, VH, VL and VH, respectively, such that the switch elements TS1 and TS511 are turned off, and switch elements TS2 and TS512 are turned on.

On the other hand, during the step 1, each of the word line signals WL2_1-WL2_512 has the pass voltage level VPASS, such that the switch elements FC2_1-FC2_512 are turned on. Each of the word line signals WL1_1-WL1_512 has the read voltage level VREAD, such that switch elements having the erase state ERS in the switch elements FC1_1-FC1_512 are turned on and switch elements having the program state PGM in the switch elements FC1_1-FC1_512 are turned off.

Correspondingly, the current signals I1, I2 and I511 have the current level IL, and the current signal I512 has the current level IH, such that the memory device 300 can determine that the search data 301 and the store data 302 has one mismatch condition that the logic value of the search data 301 is 0 and the corresponding logic value of the store data 302 is 1.

Referring to FIG. 3C and FIG. 2A, the memory device 300 is an embodiment of the memory device 200. Each of the switch elements TS1-TS512 is an embodiment of the switch element 211. Each of the switch elements FC1_1-FC1_512 is an embodiment of the switch element 212. Each of the switch elements FC2_1-FC2_512 is an embodiment of the switch element 213. Each of the string select line signals SSL1-SSL512 is an embodiment of the string select line signal SSL. Each of the word line signals WL1_1-WL1_512 is an embodiment of the word line signal WL1.

Each of the word line signals WL2_1-WL2_512 is an embodiment of the word line signal WL2. Therefore, some descriptions are not repeated for brevity.

Figure 3D:
FIG. 3D is a schematic diagram of a part of a memory device performing the second step of the search operation, illustrated according to some embodiments of present disclosure.
Figure 3D:
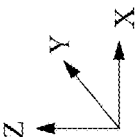

FIG. 3D is a schematic diagram of a part of a memory device 300 performing the step 2 of the search operation, illustrated according to some embodiments of present disclosure. Referring to FIG. 1 and FIG. 3C, the memory device 300 can be an embodiment of the memory array 150. During the step 2, the memory device 300 is configured to find a mismatch condition that the logic value of the search data 301 being 1 and the corresponding logic value of the store data 302 being 0.

During the step 2, in response to the string select line signals SSL1, SSL2, SSL511 and SSL512 carrying the logic values 1, 0, 1 and 0, respectively, the string select line signals SSL1, SSL2, SSL511 and SSL512 have the voltage levels VH, VL, VH and VL, respectively, such that the switch elements TS1 and TS511 are turned on, and switch elements TS2 and TS512 are turned off.

On the other hand, during the step 2, each of the word line signals WL1_1-WL1_512 has the pass voltage level VPASS, such that the switch elements FC1_1-FC1_512 are turned on. Each of the word line signals WL2_1-WL2_512 has the read voltage level VREAD, such that switch elements having the erase state ERS in the switch elements FC2_1-FC2_512 are turned on and switch elements having the program state PGM in the switch elements FC2_1-FC2_512 are turned off.

Correspondingly, the current signals 11, 12 and 1512 have the current level IL, and the current signal 1511 has the current level IH, such that the memory device 300 can determine that the search data 301 and the store data 302 has one mismatch condition that the logic value of the search data 301 is 1 and the corresponding logic value of the store data 302 is 0.

In some embodiments, when the quantity of the mismatch logic values between the search data 301 and the store data 302 is increased, the current level of the bit line signal BL(M) is increased correspondingly. When the quantity of the mismatch logic values between the search data 301 and the store data 302 is decreased, the current level of the bit line signal BL(M) is decreased correspondingly.

In some embodiments, the memory device 300 can further sum the current level of the bit line signal BL(M) at the step 1 and the current level of the bit line signal BL(M) at the step 2 to generate a total current level. The total current level is proportional to the Hamming distance between the search data 301 and the store data 302. In some embodiments, the summation operation described above can be performed by the page buffer 130 shown in FIG. 1.

In some embodiments, all of the logic values of the search data 301 and the store data 302 are match, that is, the search data 301 and the store data 302 are equal to each other. In the embodiments described above, both of the bit line signal BL(M) at the step 1 and the bit line signal BL(M) at the step 2 do not include the current signal representing match. Correspondingly, a logic value of the corresponding signal generated by the sensing amplifier in the page buffer 130 is equal to 0.

In some embodiments, the switch elements FC3_1-FC3_512, FC4_1-FC4_512, . . . , FCN_1-FCN_512 can be configured to store other store data. For example, the switch elements FC1_1-FC1_512 and FC2_1-FC2_512 can operate as the first database (referred to as database 1 following). The switch elements FC3_1-FC3_512 and FC4_1-FC4_512 can operate as the second database (referred to as database 2 following), and so on. The switch elements FC(N−1)_1-

FC(N−1)_512 and FCN_1-FCN_512 can operate as the (N/2)th database (referred to as database (N/2) following).

In some embodiments, the memory device 300 can perform corresponding search operations to the database 1 to the database (N/2) in order. Further details of the search operations performed to the database 2 to the database (N/2) are described below with the embodiments associated with FIG. 3E to FIG. 3G.

Figure 3E:
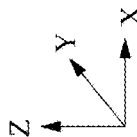
FIG. 3E is a schematic diagram of the memory device performing the search operation to a database, illustrated according to some embodiments of present disclosure.

FIG. 3E is a schematic diagram of the memory device 300 performing the search operation to the database 2, illustrated according to some embodiments of present disclosure. As shown in FIG. 3E, when the search operation is performed to the database 2, each of the word line signals WL1_1-WL1_512, WL2_1-WL2_512, WL5_1-WL5_512, . . . , WLN_1-WLN_512 is maintained at the pass voltage level VPASS, such that each of the switch elements FC1_1-FC1_512, FC2_1-FC2_512, FC5_1-FC5_512, . . . , FCN_1-FCN_512 is turned on.

On the other hand, during the step 1 of the search operation, each of the word line signals WL3_1-WL3_512 has the read voltage level VREAD, and each of the word line signals WL4_1-WL4_512 has the pass voltage level VPASS. At this moment, in response to the mismatch condition that the logic value of the search data 301 being 0 and the corresponding logic value of the store data in the database 2 being 1, one or more current signals of the current signals 11-1512 has the current level IH, such that the memory device 300 can determine the quantity of the mismatch condition that the logic value of the search data 301 being 0 and the corresponding logic value of the database 2 being 1 according to the bit line signal BL(M).

Then, during the step 2 of the search operation, each of the word line signals WL4_1-WL4_512 has the read voltage level VREAD, and each of the word line signals WL3_1-WL3_512 has the pass voltage level VPASS. At this moment, in response to the mismatch condition that the logic value of the search data 301 being 1 and the corresponding logic value of the store data in the database 2 being 0, one or more current signals of the current signals 11-1512 has the current level IH, such that the memory device 300 can determine the quantity of the mismatch condition that the logic value of the search data 301 being 1 and the corresponding logic value of the database 2 being 0 according to the bit line signal BL(M).

Then, the memory device 300 can sum the current level of the bit line signal BL(M) at the step 1 and the current level of the bit line signal BL(M) at the step 2 to generate the total current level, and determine the quantity of the mismatch condition between the search data and the database 2 according to the total current level, that is, the Hamming distance between the search data and the database 2.

Figure 3F:
FIG. 3F is a schematic diagram of the memory device performing the search operation to a database, illustrated according to some embodiments of present disclosure.
Figure 3F:
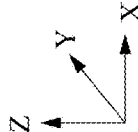

FIG. 3F is a schematic diagram of the memory device 300 performing the search operation to the database 3, illustrated according to some embodiments of present disclosure. As shown in FIG. 3F, when the search operation is performed to the database 3, each of the word line signals WL1_1-WL1_512, WL2_1-WL2_512, WL3_1-WL3_512, WL4_1-WL4_512, WL7_1-WL7_512, WLN_1-WLN_512 is maintained at the pass voltage level VPASS, such that each of the switch elements FC1_1-FC1_512, FC2_1-FC2_512, FC3_1-FC3_512, FC4_1-FC4_512, FC7_1-FC7_512, . . . , FCN_1-FCN_512 is turned on.

On the other hand, during the step 1 of the search operation, each of the word line signals WL5_1-WL5_512 has the read voltage level VREAD, and each of the word line signals WL6_1-WL6_512 has the pass voltage level VPASS. At this moment, in response to the mismatch condition that the logic value of the search data 301 being 0 and the corresponding logic value of the store data in the database 3 being 1, one or more current signals of the current signals 11-1512 has the current level IH, such that the memory device 300 can determine the quantity of the mismatch condition that the logic value of the search data 301 being 0 and the corresponding logic value of the database 3 being 1 according to the bit line signal BL(M).

Then, during the step 2 of the search operation, each of the word line signals WL6_1-WL6_512 has the read voltage level VREAD, and each of the word line signals WL5_1-WL5_512 has the pass voltage level VPASS. At this moment, in response to the mismatch condition that the logic value of the search data 301 being 1 and the corresponding logic value of the store data in the database 3 being 0, one or more current signals of the current signals 11-1512 has the current level IH, such that the memory device 300 can determine the quantity of the mismatch condition that the logic value of the search data 301 being 1 and the corresponding logic value of the database 3 being 0 according to the bit line signal BL(M).

Then, the memory device 300 can sum the current level of the bit line signal BL(M) at the step 1 and the current level of the bit line signal BL(M) at the step 2 to generate the total current level, and determine the quantity of the mismatch condition between the search data and the database 3 according to the total current level, that is, the Hamming distance between the search data and the database 3.

Figure 3G:
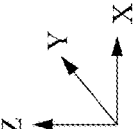
FIG. 3G is a schematic diagram of the memory device performing the search operation to a database, illustrated according to some embodiments of present disclosure.

FIG. 3G is a schematic diagram of the memory device 300 performing the search operation to the database (N/2), illustrated according to some embodiments of present disclosure. As shown in FIG. 3G, when the search operation is performed to the database (N/2), each of the word line signals WL1_1-WL1_512, WL2_1-WL2_512, . . . , WL(N−2)_1-WL (N−2)_512 is maintained at the pass voltage level VPASS, such that each of the switch elements FC1_1-FC1_512, FC2_1-FC2_512, . . . , FC(N−2)_1-FC(N−2)_512 is turned on.

On the other hand, during the step 1 of the search operation, each of the word line signals WL (N−1)_1-WL (N−1)_512 has the read voltage level VREAD, and each of the word line signals WLN_1-WLN_512 has the pass voltage level VPASS. At this moment, in response to the mismatch condition that the logic value of the search data 301 being 0 and the corresponding logic value of the store data in the database (N/2) being 1, one or more current signals of the current signals 11-1512 has the current level IH, such that the memory device 300 can determine the quantity of the mismatch condition that the logic value of the search data 301 being 0 and the corresponding logic value of the database (N/2) being 1 according to the bit line signal BL(M).

Then, during the step 2 of the search operation, each of the word line signals WLN_1-WLN_512 has the read voltage level VREAD, and each of the word line signals WL (N−1)_1-WL (N−1)_512 has the pass voltage level VPASS. At this moment, in response to the mismatch condition that the logic value of the search data 301 being 1 and the corresponding logic value of the store data in the database (N/2) being 0, one or more current signals of the current signals 11-1512 has the current level IH, such that the memory device 300 can determine the quantity of the mismatch condition that the logic value of the search data 301 being 1 and the corresponding logic value of the database (N/2) being 0 according to the bit line signal BL(M).

Then, the memory device 300 can sum the current level of the bit line signal BL(M) at the step 1 and the current level of the bit line signal BL(M) at the step 2 to generate the total current level, and determine the quantity of the mismatch condition between the search data and the database (N/2) according to the total current level, that is, the Hamming distance between the search data and the database (N/2).

Figure 4A:
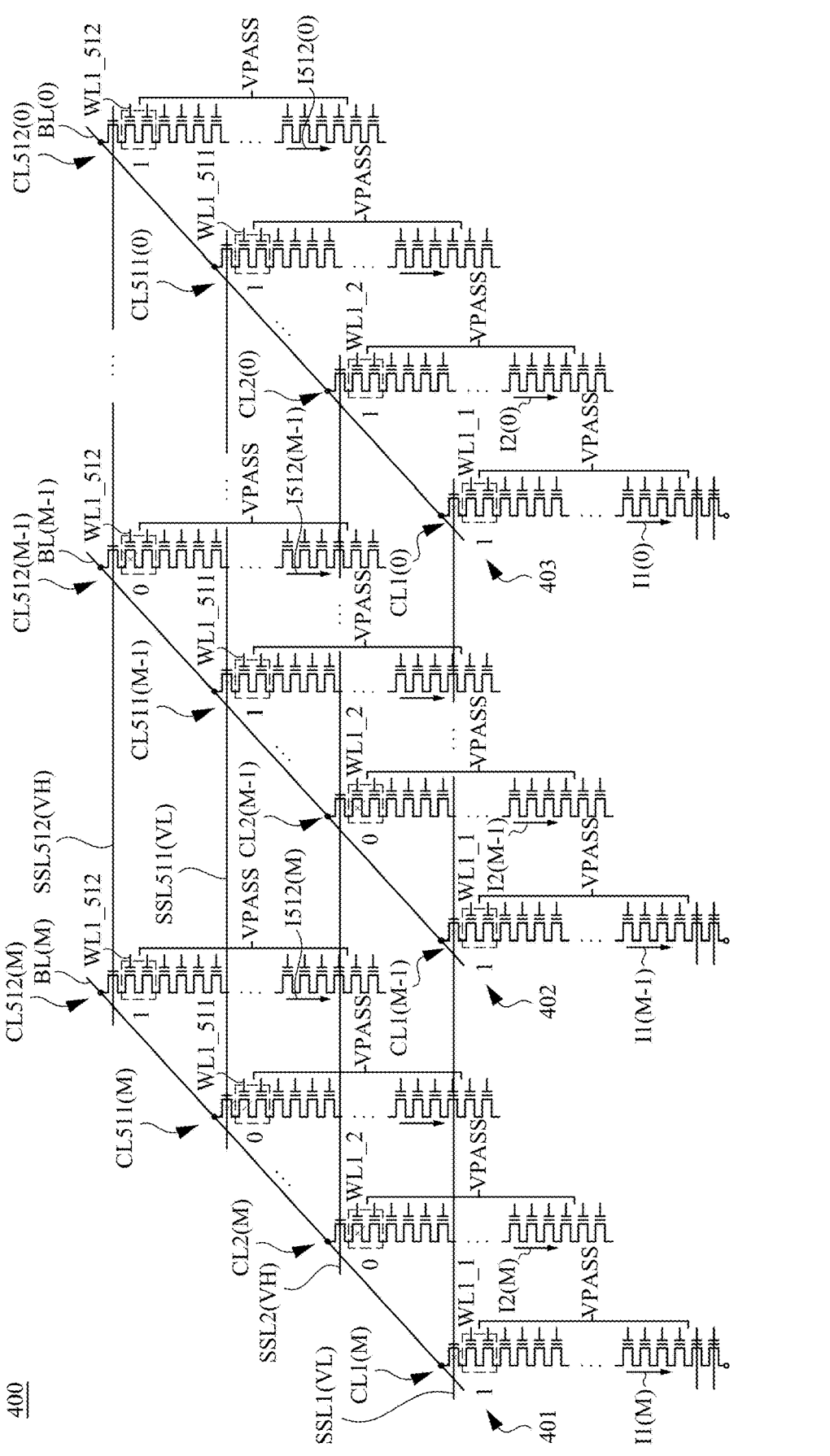
FIG. 4A is a schematic diagram of a part of a memory device performing the first step of the search operation, illustrated according to some embodiments of present disclosure.

FIG. 4A is a schematic diagram of a part of a memory device 400 performing the step 1 of the search operation, illustrated according to some embodiments of present disclosure. Referring to FIG. 1 and FIG. 4A, the memory device 400 can be an embodiment of the memory array 150. As shown in FIG. 4A, the memory device 400 includes memory columns CL1(0)-CL512(0), . . . , CL1(M−1)-CL512(M−1) and CL1(M)-CL512(M).

In some embodiments, the memory columns CL1(0)-CL512(0), . . . , CL1(M−1)-CL512(M−1) and CL1(M)-CL512(M) are configured to generate current signals 11(0)-1512(0), . . . , 11(M−1)-1512(M−1) and 11(M)-1512(M), respectively.

Then, the memory device 400 sums the current signals 11(0)-1512(0) to generate the bit line signal BL(0), sums the current signals 11(M−1)-1512(M−1) to generate the bit line signal BL(M−1), and sums the current signals 11(M)-1512(M) to generate the bit line signal BL(M).

Referring to FIG. 3C and FIG. 4A, the memory device 400 can be an embodiment of the memory device 300. Configurations of the memory columns CL1(0)-CL512(0), . . . , CL1(M−1)-CL512(M−1) and CL1(M)-CL512(M) are similar with the configurations of the memory columns CL1-CL512. Therefore, for brevity, some descriptions are not repeated.

For illustration purpose, the element labels of the memory columns CL1(0)-CL512(0), . . . , CL1(M−1)-CL512(M−1) and CL1(M)-CL512(M) are similar with the element labels of the memory columns CL1-CL512. For example, the memory column CL1(0) includes switch elements TS1(0), FC1_1(0)-FCN_1(0), TG1(0) and TC1(0) coupled in series. Configurations of the switch elements TS1(0), FC1_1(0)-FCN_1(0), TG1(0) and TC1(0) are similar with the configurations of the switch elements TS1, FC1_1-FCN_1, TG1 and TC1 shown in FIG. 3C.

For another example, the memory column CL512(M) includes switch elements TS512(M), FC512_512(M)-FCN_512(M), TG512(M) and TC512(M) coupled in series. Configurations of the switch elements TS512(M), FC512_512(M)-FCN_512(M), TG512(M) and TC512(M) are similar with the configurations of the switch elements TS512, FC512_512-FCN_512, TG512 and TC512 shown in FIG. 3C. For brevity, some element labels are not shown in FIG. 4A.

In some embodiments, each of the switch elements TS1(0)-TS1(M) is configured to receive the string select line signal SSL1. Each of the switch elements TS2(0)-TS2(M) is configured to receive the string select line signal SSL2, and so on. Each of the switch elements TS511(0)-TS511(M) is configured to receive the string select line signal SSL511. Each of the switch elements TS512(0)-TS512(M) is configured to receive the string select line signal SSL512.

In some embodiments, each of the switch elements FC1_1 (0)-FC1_1(M) is configured to receive the word line signal WL1_1. Each of the switch elements FC1_2(0)-FC1_2(M) is configured to receive the word line signal WL1_2, and so on. Each of the switch elements FC1_511(0)-FC1_511(M) is configured to receive the word line signal WL1_511. Each of the switch elements FC1_512(0)-FC1_512(M) is configured to receive the word line signal WL1_512.

Similarly, each of the switch elements FC2_1(0)-FC2_1(M) is configured to receive the word line signal WL2_1. Each of the switch elements FC2_2(0)-FC2_2(M) is configured to receive the word line signal WL2_2, and so on. Each of the switch elements FC2_511(0)-FC2_511(M) is configured to receive the word line signal WL2_511. Each of the switch elements FC2_512(0)-FC2_512(M) is configured to receive the word line signal WL2_512.

In some embodiments, the switch elements FC1_1(M)-FC1_512(M) and FC2_1(M)-FC2_512(M) are configured to store store data 401. The switch elements FC1_1(M–1)-FC1_512(M–1) and FC2_1(M–1)-FC2_512(M–1) are configured to store store data 402. The switch elements FC1_1(0)-FC1_512(0) and FC2_1(0)-FC2_512(0) are configured to store store data 403.

In the embodiment shown in FIG. 4A, the first logic value, the second logic value, the 511th logic value and the 512th logic value of the store data 401 are 1, 0, 0 and 1, respectively. The first logic value, the second logic value, the 511th logic value and the 512th logic value of the store data 402 are 1, 0, 1 and 0, respectively. The first logic value, the second logic value, the 511th logic value and the 512th logic value of the store data 403 are 1, 1, 1 and 1, respectively Alternatively stated, the memory cells corresponding to the switch elements FC1_1(M), FC2_1(M), FC1_512(M), FC2_512(M), FC1_1(M–1), FC2_1(M–1), FC1_511(M–1), FC2_511(M–1), FC1_1(0), FC2_1(0), FC1_2(0), FC2_2(0), FC1_511(0), FC2_511(0), FC1_512(0), FC2_512(0) are configured to store the logic value 1. The memory cells corresponding to the switch elements FC1_2(M), FC2_2(M), FC1_511(M), FC2_511(M), FC1_2(M–1), FC2_2(M–1), FC1_512(M–1), FC2_512(M–1) are configured to store the logic value 1.

Correspondingly, each of the switch elements FC1_1(M), FC1_512(M) FC1_1(M–1), FC1_511(M–1), FC1_1(0), FC1_2(0), FC1_511(0), FC1_512(0), FC2_2(M), FC2_511(M), FC2_2(M–1), FC2_512(M–1) has the erase state ERS. Each of the switch elements FC2_1(M), FC2_512(M), FC2_1(M–1), FC2_511(M–1), FC2_1(0), FC2_2(0), FC2_511(0), FC2_512(0), FC1_2(M), FC1_511(M), FC1_2(M–1), FC1_512(M–1) has the program state PGM.

Alternatively stated, each of the switch elements FC1_1(M), FC1_512(M) FC1_1(M–1), FC1_511(M–1), FC1_1(0), FC1_2(0), FC1_511(0), FC1_512(0), FC2_2(M), FC2_511(M), FC2_2(M–1), FC2_512(M–1) has the threshold voltage level LVT. Each of the switch elements FC2_1(M), FC2_512(M), FC2_1(M–1), FC2_511(M–1), FC2_1(0), FC2_2(0), FC2_511(0), FC2_512(0), FC1_2(M), FC1_511(M), FC1_2(M–1), FC1_512(M–1) has the threshold voltage level HVT.

In some embodiments, the memory device 400 can perform the search operation to compare the search data 301 carried by the string select line signals SSL1-SSL512 and the store data 401-403.

During the step 1 of the search operation, in response to the string select line signals SSL1, SSL2, SSL511 and SSL512 carrying the logic values 1, 0, 1 and 0, respectively, the string select line signals SSL1, SSL2, SSL511 and SSL512 have the voltage levels VL, VH, VL and VH, respectively, such that the switch elements TS1(0)-TS1(M) and TS511(0)-TS511(M) are turned off, and the switch elements TS2(0)-TS2(M) and TS512(0)-TS512(M) are turned on.

On the other hand, during the step 1, the word line signals WL2_1-WL2_512 have the pass voltage level VPASS, such that the switch elements FC2_1(0)-FC2_512(0), FC2_1(M–1)-FC2_512(M–1) and FC2_1(M)-FC2_512(M) are turned on. The word line signals WL1_1-WL1_512 have the read voltage level VREAD, such that the switch elements in the switch elements FC1_1(0)-FC1_512(0), FC1_1(M–1)-FC1_512(M–1) and FC1_1(M)-FC1_512(M) having the erase state ERS are turned on, and the switch elements having the program state PGM are turned off.

Correspondingly, the current signals 11(M), 11(M–1), 11(0), 12(M), 12(M–1), 1511(M), 1511(M–1), 1511(0) and 1512(M–1) have the current level IL, and the current signals 1512(M), 12(0) and 1512(0) have the current level IH.

Alternatively stated, in response to the mismatch condition that the switch elements FC1_512(M) and FC2_512(M) stores the logic value of 1 and the string select line signal SSL512 carries the logic value 0, the current signal 1512(M) has the current level IH. In response to the mismatch condition that the switch elements FC1_2(0) and FC2_2(0) stores the logic value of 1 and the string select line signal SSL2 carries the logic value 0, the current signal 12(0) has the current level IH. In response to the mismatch condition that the switch elements FC1_512(0) and FC2_512(0) stores the logic value of 1 and the string select line signal SSL512 carries the logic value 0, the current signal 1512(0) has the current level IH.

Correspondingly, the memory device 400 can determine that, between the search data 301 and he store data 401, there are one mismatch condition that the logic value of the search data 301 is 0 and the logic value of the store data 401 is 1 according to the bit line signal BL(M) which includes the current signal 1512(M). The memory device 400 also can determine that, between the search data 301 and the store data 403, there are two mismatch conditions that the logic value of the search data 301 is 0 and the logic value of the store data 403 is 1 according to the bit line signal BL(0) which includes the current signals 12(0) and 1512(0).

Figure 4B:
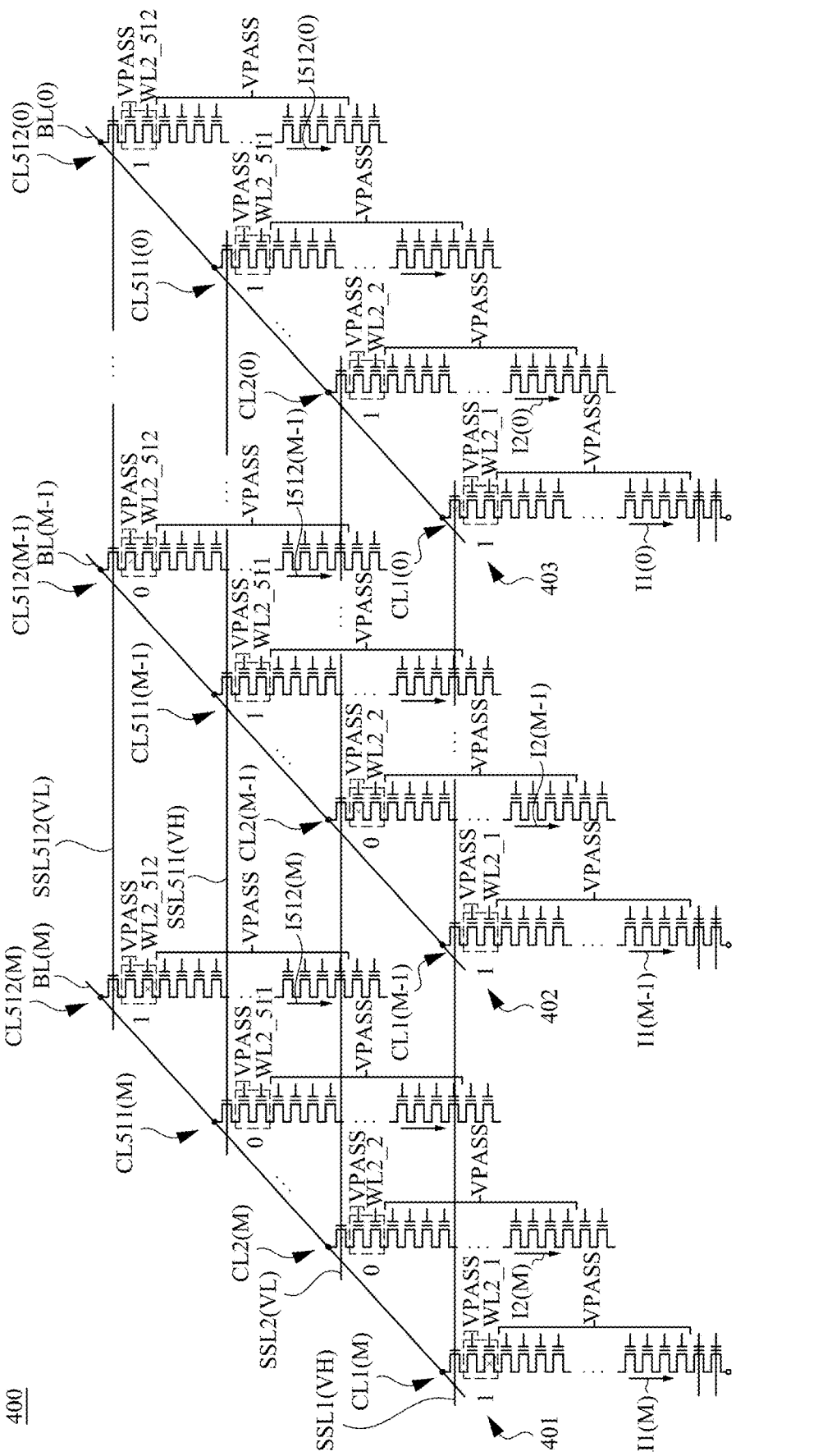
FIG. 4B is a schematic diagram of a part of the memory device performing the second step of the search operation, illustrated according to some embodiments of present disclosure.

FIG. 4B is a schematic diagram of a part of the memory device 400 performing the step 2 of the search operation, illustrated according to some embodiments of present disclosure. During the step 2 of the search operation, in response to the string select line signals SSL1, SSL2, SSL511 and SSL512 carrying the logic values 1, 0, 1 and 0, respectively, the string select line signals SSL1, SSL2, SSL511 and SSL512 have the voltage levels VH, VL, VH and VL, respectively, such that the switch elements TS1(0)-TS1(M) and TS511(0)-TS511(M) are turned on, and the switch elements TS2(0)-TS2(M) and TS512(0)-TS512(M) are turned off.

On the other hand, during the step 2, the word line signals WL1_1-WL1_512 have the pass voltage level VPASS, such that the switch elements FC1_1(0)-FC1_512(0), FC1_1(M–1)-FC1_512(M–1) and FC1_1(M)-FC1_512(M) are turned on. The word line signals WL2_1-WL2_512 have the read voltage level VREAD, such that the switch elements in the switch elements FC2_1(0)-FC2_512(0), ... , FC2_1(M–1)-FC2_512(M–1) and FC2_1(M)-FC2_512(M) having the erase state ERS are turned on, and the switch elements having the program state PGM are turned off.

Correspondingly, the current signals 11(M), 11(M–1), 11(0), 12(M), 12(M–1), 12(0), 1511(M–1), 1511(0), 1512(M), 1512(M–1) and 1512(0) have the current level IL, and the current signal 1511(M) has the current level IH. Alternatively stated, in response to the mismatch condition that the switch elements FC1_511(M) and FC2_511(M) stores the logic value of 0 and the string select line signal SSL511 carries the logic value 1, the current signal 1511(M) has the current level IH Correspondingly, the memory device 400 can determine that, between the search data 301 and he store data 401, there are one mismatch condition that the logic value of the search data 301 is 1 and the logic value of the store data 401 is 0 according to the bit line signal BL(M) which includes the current signal 1511(M).

In some embodiments, the memory device 400 is config- ured to sum the voltage levels of the bit line signal BL(M) to determine the Hamming distance between the search data 301 and the store data 401. Specifically, in response to the bit line signal BL(M) during the step 1 including 1 current signal having the current level IH and the bit line signal BL(M) during the step 2 including 1 current signal having the current level IH, the Hamming distance between the search data 301 and the store data 401 is 2.

Similarly, the memory device 400 is configured to sum the voltage levels of the bit line signal BL(M−1) to determine the Hamming distance between the search data 301 and the store data 402. Specifically, in response to the bit line signal BL(M−1) during the step 1 including 0 current signal having the current level IH and the bit line signal BL(M−1) during the step 2 including 0 current signal having the current level IH, the Hamming distance between the search data 301 and the store data 402 is 0.

Similarly, the memory device 400 is configured to sum the voltage levels of the bit line signal BL(0) to determine the Hamming distance between the search data 301 and the store data 403. Specifically, in response to the bit line signal BL(0) during the step 1 including 2 current signal having the current level IH and the bit line signal BL(0) during the step 2 including 0 current signal having the current level IH, the Hamming distance between the search data 301 and the store data 403 is 2.

In summary, according to the current levels of the bit line signals BL(0), BL(M−1) and BL(M) at the step 1 and the step 2, the memory device 400 can determine that the similarity between the search data 301 and the store data 402 is larger than the search data 301 and the store data 403, and the similarity between the search data 301 and the store data 403 is equal to the search data 301 and the store data 401.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An operating method of a memory device, comprising:
   carrying a first search bit by a first string select line signal;
   controlling a first switch element by the first string select line signal;
   storing a first data bit by a second switch element and a third switch element; and
   comparing the first search bit and the first data bit to generate a first bit line signal,
   wherein in response to the first search bit having a first logic value, the first string select line signal has a first voltage level and a second voltage level in order,
   in response to the first search bit having a second logic value, the first string select line signal has the second voltage level and the first voltage level in order,
   the first logic value is different from the second logic value,

22 the second voltage level is different from the first voltage level, and
   the first switch element, the second switch element and the third switch element are coupled in series.

2. The operating method of claim 1, wherein comparing the first search bit and the first data bit comprises:
   controlling the second switch element and the third switch element by a first word line signal and a second word line signal, respectively; and
   adjusting the first word line signal from a read voltage level to a pass voltage level,
   wherein when the first word line signal has the read voltage level, the second word line signal has the pass voltage level, and
   when the first word line signal has the pass voltage level, the second word line signal has the read voltage level.

3. The operating method of claim 1, wherein comparing the first search bit and the first data bit comprises:
   in a condition that the first search bit has the first logic value and the first data bit has the second logic value, when the first string select line signal has the second voltage level, turning on each of the first switch element, the second switch element and the third switch element.

4. The operating method of claim 3, wherein comparing the first search bit and the first data bit further comprises:
   in the condition that the first search bit has the first logic value and the first data bit has the second logic value, when the first string select line signal has the first voltage level, turning off each of the first switch element and the second switch element, and turning on the third switch element.

5. The operating method of claim 1, wherein comparing the first search bit and the first data bit comprises:
   in a condition that the first search bit has the second logic value and the first data bit has the first logic value, when the first string select line signal has the second voltage level, turning on each of the first switch element, the second switch element and the third switch element.

6. The operating method of claim 5, wherein comparing the first search bit and the first data bit further comprises:
   in the condition that the first search bit has the second logic value and the first data bit has the first logic value, when the first string select line signal has the first voltage level, turning off each of the first switch element and the third switch element, and turning on the second switch element.

7. The operating method of claim 1, wherein comparing the first search bit and the first data bit comprises:
   in a condition that each of the first search bit and the first data bit has the first logic value, when the first string select line signal has the second voltage level, turning on each of the first switch element and the second switch element, and turning off the third switch element.

8. The operating method of claim 7, wherein comparing the first search bit and the first data bit further comprises:
   in the condition that each of the first search bit and the first data bit has the first logic value, when the first string select line signal has the first voltage level, turning off the first switch element, and turning on each of the second switch element and the third switch element.

9. The operating method of claim 1, wherein comparing the first search bit and the first data bit comprises:
   in a condition that each of the first search bit and the first data bit has the second logic value, when the first string select line signal has the second voltage level, turning on each of the first switch element and the third switch element, and turning off the second switch element.

10. The operating method of claim 9, wherein comparing the first search bit and the first data bit further comprises:

in the condition that each of the first search bit and the first data bit has the second logic value, when the first string select line signal has the first voltage level, turning off the first switch element, and turning on each of the second switch element and the third switch element.

11. A memory device, comprising:

a first switch element configured to output a first current signal at a node according to a first string select line signal; and a second switch element configured to output a second current signal at the node according to a second string select line signal, wherein in response to the first string select line signal carrying a first logic value, the first switch element is turned off and turned on in order, in response to the second string select line signal carrying a second logic value, the second switch element is turned on and turned off in order, the first string select line signal is configured to carry a first search bit, and in response to the first search bit having the first logic value, the first string select line signal has a first voltage level and a second voltage level in order, in response to the first search bit having the second logic value, the first string select line signal has the second voltage level and the first voltage level in order.

12. The memory device of claim 11, further comprising:

a third switch element coupled to the first switch element, and configured to receive a first word line signal;

a fourth switch element coupled to the third switch element, and configured to receive a second word line signal;

a fifth switch element coupled to the second switch element, and configured to receive a third word line signal; and a sixth switch element coupled to the fifth switch element, and configured to receive a fourth word line signal, wherein each of the first word line signal and the third word line signal has a read voltage level and a pass voltage level in order, each of the second word line signal and the fourth word line signal has the pass voltage level and the read voltage level in order, and the read voltage level is smaller than the pass voltage level.

13. The memory device of claim 12, wherein in response to the third switch element and the fourth switch element storing the second logic value and the first string select line signal carrying the first logic value, when the first switch element is turned on, the second word line signal has the read voltage level and each of the third switch element and the fourth switch element is turned on.

14. The memory device of claim 12, wherein in response to the fifth switch element and the sixth switch element storing the first logic value and the second string select line signal carrying the second logic value, when the second switch element is turned on, the third word line signal has the read voltage level and each of the fifth switch element and the sixth switch element is turned on.

15. The memory device of claim 14, wherein in response to the fifth switch element and the sixth switch element storing the first logic value and the second string select line signal carrying the second logic value, when the second switch element is turned off, the fourth word line signal has the read voltage level and the sixth switch element is turned off.

16. The memory device of claim 14, wherein in response to the third switch element and the fourth switch element storing the second logic value and the first string select line signal carrying the first logic value, when the first switch element is turned off, the second word line signal has the read voltage level and the third switch element is turned off.

17. The memory device of claim 12, further comprising:

a seventh switch element coupled to the fourth switch element, and configured to receive a fifth word line signal, wherein when each of the first word line signal and the second word line signal has the pass voltage level, the fifth word line signal has the read voltage level and the pass voltage level in order.

18. The memory device of claim 17, further comprising:

an eighth switch element coupled to the seventh switch element, and configured to receive a sixth word line signal, wherein when each of the first word line signal and the second word line signal has the pass voltage level, the sixth word line signal has the pass voltage level and the read voltage level in order.

19. A memory device, comprising:

a first memory column configured to generate a first current signal according to a string select line signal; and a second memory column configured to generate a second current signal according to the string select line signal, wherein in response to each of the first memory column and the second memory column storing a first logic value and the string select line signal carrying a second logic value, a voltage level of the string select line signal is changed to control switch elements in the first memory column and the second memory column such that the first current signal has a first current level and a second current level in order, and the second current signal has the first current level and the second current level in order, and the second current level is lower than the first current level, the string select line signal is configured to carry a first search bit, and in response to the first search bit having the first logic value, the string select line signal has a first voltage level and a second voltage level in order, in response to the first search bit having the second logic value, the string select line signal has the second voltage level and the first voltage level in order.

20. The memory device of claim 19, further comprising:

a third memory column configured to generate a third current signal according to the string select line signal, wherein in response to the third memory column storing the second logic value and the string select line signal carrying the first logic value, the third current signal is maintained at the second current level when the first current signal is changed from the first current level to the second current level.

* * * * *